United States Patent
Tran et al.

(10) Patent No.: US 7,398,175 B2
(45) Date of Patent: *Jul. 8, 2008

(54) METHOD AND APPARATUS PROVIDING MULTIPLE CHANNEL MULTIPLE INSTRUMENT TRIGGERING

(75) Inventors: Que Thuy Tran, Beaverton, OR (US); John C. De Lacy, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/323,503

(22) Filed: Dec. 18, 2002

(65) Prior Publication Data
US 2004/0119620 A1    Jun. 24, 2004

(51) Int. Cl.
*G06F 19/00* (2006.01)

(52) U.S. Cl. ...................................... 702/121
(58) Field of Classification Search ............. 702/66–68, 702/79, 117, 118, 121, 124, 125, 176, 187; 324/121 R, 379; 341/122, 123, 155
See application file for complete search history.

(56) References Cited

U.S. PATENT DOCUMENTS

| | | | | |
|---|---|---|---|---|
| 6,628,112 B2* | 9/2003 | Pisipaty | ................... | 324/76.53 |
| 6,812,688 B2* | 11/2004 | Tan et al. | ................. | 324/121 R |
| 6,832,174 B2* | 12/2004 | Tran et al. | .................... | 702/121 |
| 7,065,458 B2* | 6/2006 | Tran et al. | .................... | 702/66 |
| 7,285,948 B2* | 10/2007 | Tran et al. | ................. | 324/158.1 |
| 2002/0147943 A1* | 10/2002 | Slaugh et al. | ................. | 714/39 |
| 2003/0220753 A1* | 11/2003 | Pickerd et al. | ................ | 702/67 |
| 2003/0231187 A1* | 12/2003 | Dobyns et al. | ............. | 345/619 |
| 2004/0008160 A1* | 1/2004 | Etheridge et al. | ............. | 345/30 |
| 2004/0124848 A1* | 7/2004 | Tran et al. | .................... | 324/543 |

OTHER PUBLICATIONS

Book: The Art of Electronics, Paul Horowitz, Winfield Hill, Second Edition, Cambridge University Press, 1980 and 1989, Chapter 11, Microprocessor Support Chips, 11.10, p. 801.

* cited by examiner

*Primary Examiner*—Michael P Nghiem
(74) *Attorney, Agent, or Firm*—Moser, Patterson & Sheridan LLP; Thomas F. Lenihan

(57) ABSTRACT

A system, method and apparatus for triggering a plurality of test and measurement instruments in a substantially simultaneous manner logically combines a trigger enable signal provided by each of a plurality of signal processing devices to produce a combined trigger signal. The combined trigger signal then triggers each of the plurality of signal Processing devices.

7 Claims, 2 Drawing Sheets

METHOD AND APPARATUS PROVIDING MULTIPLE CHANNEL MULTIPLE INSTRUMENT TRIGGERING

FIELD OF THE INVENTION

The invention relates generally to signal analysis devices and, more specifically, to a method and apparatus for providing signal acquisition triggering using multiple signal acquisition devices and/or multiple input channels.

BACKGROUND OF THE INVENTION

Signal acquisition devices or test and measurement devices such as digital storage oscilloscopes (DSOs) and the like typically include a triggering means by which the display or acquisition of a signal under test (SUT) may be synchronized to a specific event or events. A DSO, for example, may include means for operationally combining a plurality of trigger input conditions to produce a compound trigger event. For example, in a four channel DSO, where each of the four input channels includes respective trigger processing circuitry, four respective channel trigger signals may be logically processed (e.g., ANDed) together to produce a compound trigger signal. The compound trigger signal may then be applied to one or more of the input channels to acquire data of a specific type. DSOs also provide a full range of analog triggering functions such as, rising edge, pulsewidth, and runt triggering.

Unfortunately, there is at present no capability to derive a compound trigger condition utilizing more than the available number of channels on a particular instrument. Nor is there a way at present to combine analog and logic state triggering from multiple instruments and trigger all of the instruments from the combined trigger signal.

SUMMARY OF INVENTION

These and other deficiencies of the prior art are addressed by the present invention of a method and apparatus enabling the generation of a compound triggering event using combined trigger inputs from multiple instruments.

The subject invention is adapted, in one embodiment, to a method comprising logically combining a trigger enable signal provided by each of a plurality of signal processing devices to produce a combined trigger signal, the combined trigger signal triggering each of the plurality of signal processing devices.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

The subject invention will be primarily described within the context of test measurement devices such as a plurality of digital storage oscilloscopes (DSOs). However, it will be appreciated by those skilled in the art that the invention may be advantageously employed in any environment where multiple signal analysis devices having respective triggering functions or trigger event decoding functions (e.g., logic analyzers) are desired to process signals under test.

Figure 1:
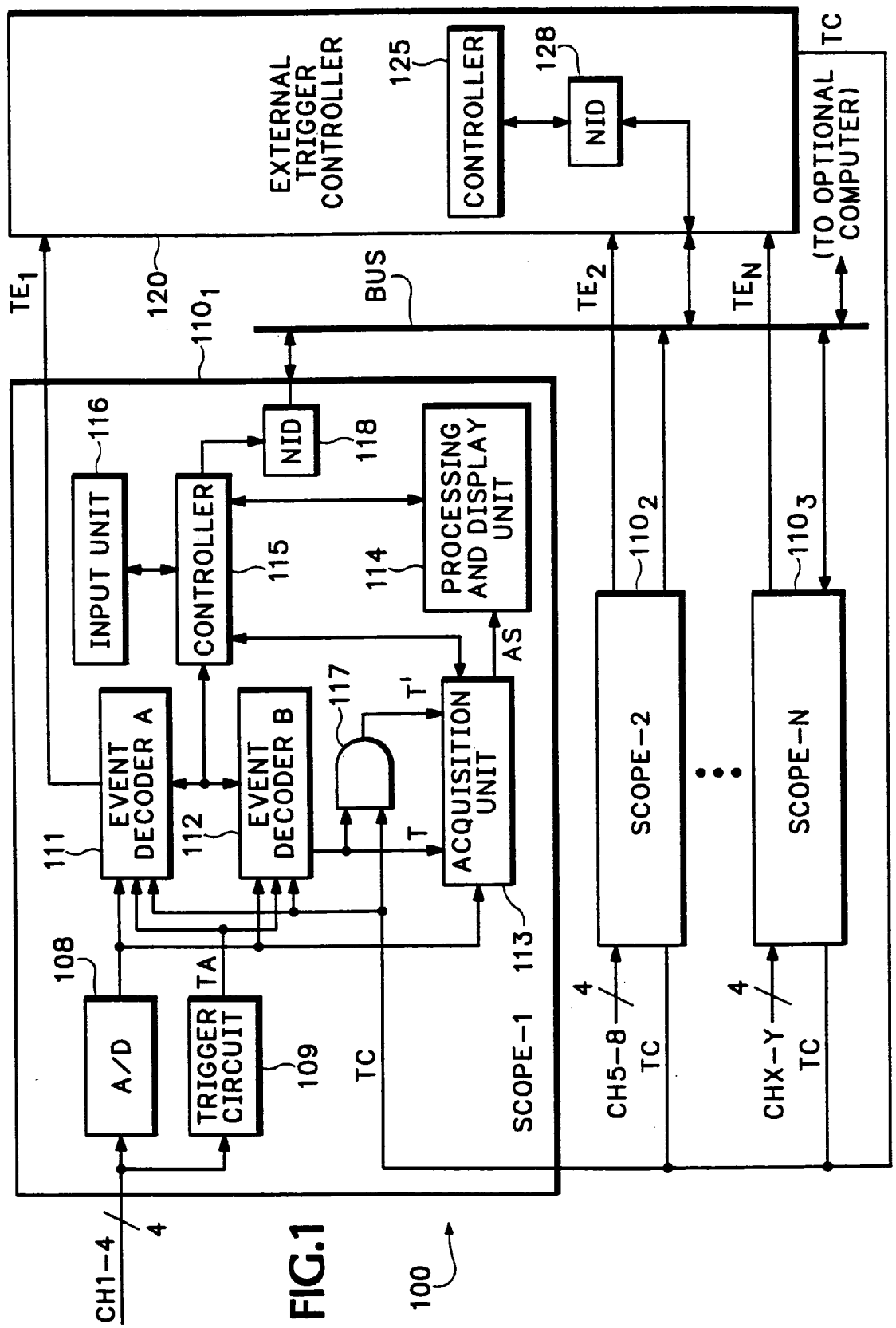
FIG. 1 depicts a high-level block diagram of a signal analysis system including trigger processing circuitry according to an embodiment of the invention.

FIG. 1 depicts a high-level block diagram of a data acquisition system according to an embodiment of the present invention. Specifically, the system 100 of FIG. 1 comprises a plurality of signal or data acquisition devices (i.e., test and measurement instruments) such as digital storage oscilloscopes (DSOs), logic analyzers and the like denoted as acquisition devices $110_1$, $110_2$, and so on up to $110_N$ (collectively acquisition devices 110). Each of the acquisition devices 110 comprises, illustratively, a four channel DSO, though more or fewer channels may be used for any or all of the acquisition devices 110. Moreover, more or fewer acquisition devices may be used and, in various embodiments, different types of acquisition devices may be used.

A first acquisition device $110_1$ receives data from a first four respective input channels CH1-4, a second acquisition device $110_2$ receives data from a respective second four input channels CH5-8 and so on up to an $N^{th}$ acquisition device $110_N$ receiving data from a respective $N^{th}$ four input channels CHX-Y.

Each of the acquisition devices 110 comprises a first event decoder 111, a second event decoder 112, an acquisition unit 113, a processing and display unit 114, a controller 115, an input unit 116, an optional trigger logic unit 117 and an optional network interface device (NID) 118. Assuming a four channel DSO embodiment, and referring to first acquisition unit $110_1$, each of the four CH1-4 input signals under test (SUT) is coupled to the first event decoder 111, second event decoder 112 and acquisition unit 113 via a digitizer (A/D converter) 108 that receives analog signals under test and provides digitized samples to the circuitry described above. In addition, an analog trigger circuit 109 receives the analog signals under test and provides a trigger output signal TA to the first 111 and second 112 event decoders upon detection of a preselected analog signal condition. Such analog signal conditions may include detection of rising edge, falling edge, pulsewidth, period, glitch, and runt, to name but a few. The analog trigger circuit 109 is optionally controlled (e.g. selection of analog signal condition, trigger logic and the like) by the controller 115.

The acquisition unit 113 comprises, illustratively, at least one decimator for each of the four input signals as well as supporting acquisition memory. The acquisition unit 113 is responsive to a trigger signal T provided by the second event decoder 112 to produce an acquired sample stream AS suitable for use by the processing and display unit 114. The trigger signal T may be provided directly by the second event decoder 112 or via the trigger logic unit 117. That is, the trigger signal T provided by the second event decoder 112 may be further processed using the trigger logic unit 117. The acquisition unit 113 is optionally responsive to the controller 115 to change decimator functions, memory allocations and other functions as appropriate, and as appreciated by those skilled in the art informed by the present disclosure. The acquisition unit may also communicate acquired data, such as the acquired sample stream AS, to the controller 115 for processing or further communication to the optional NID 118.

The processing and display unit 114 comprises, illustratively, a display device (not shown) and associated data processing circuitry suitable for converting the acquired sample stream AS into visual imagery. The processing and display unit 114 is responsive to the controller 115 to set various parameters such as volts per division, time scale and the like. It will be appreciated by those skilled in the art that within the context of a data acquisition system utilizing many acquisition devices 110, it is not necessary to include a processing and display unit 114 in each of the acquisition devices. Moreover, in the case of acquisition devices 110 comprising modules or cards inserted within a computing device or arranged using a back plane, a single processing and display unit 114 may provide an image processing function for any one (or more) of the acquisition devices 110.

The input unit 116 comprises a keypad, pointing device or other means adapted to provide user input to the controller 115. The controller 115, in response to such user input, adapts the operations of the data acquisition unit 110 to perform various data acquisition, triggering, processing, display and other functions. In addition, user input may be used to trigger automatic calibration functions and/or adapt other operating parameters of a DSO, logic analysis or other data acquisition device. Such input may also be provided to the controller 115 via a communications link operably coupled to the optional NID 118.

It will be appreciated by those skilled in the art that standard signal processing components (not shown) such as signal buffering circuitry, signal conditioning circuitry and the like are also employed as appropriate to enable the various functions described herein. For example, the digitized input signals CH1-4 are sampled at a sufficiently high rate to enable appropriate processing by the various event decoders and acquisition unit.

The first event decoder 111 processes one or more of the received input channel data streams CH1-4 according to a combinational and/or sequential logic function to determine whether a predefined triggering condition exists. For example, the first event decoder 111 may be programmed by the controller 115 to examine all or some of the four input channels data streams CH1-4 to determine whether a triggering event such as a desired sequence of logic levels indicative of a portion of a data word or the like has been received. As noted above, event decoder 111 also receives from analog trigger circuit 109 an indication (i.e., analog trigger signal TA) that an analog trigger condition has been detected. In response to the determination or decoding of a desired triggering event, a trigger enable signal TE is generated by the first event decoder 111. Each of the acquisition devices $110_1$ through $110_N$ produces a respective trigger enable signal $TE_1$ through $TE_N$. Each of the produced trigger signals $TE_1$ through $TE_N$ is coupled to an external trigger controller 120. Thus, logical event or analog condition indicative signals associated with each (or at least some) of the input signals are provided to the external trigger controller 120 for further processing.

The external trigger controller 120 processes the received trigger signals $TE_1$ through $TE_N$ to determine whether a desired combined trigger condition is met. Such processing may comprise any combinational and/or sequential logic processing of the trigger signals, such as conventional logic processing (AND NAND, XOR, etc.). In response to the satisfaction of the desired combined trigger condition, the external trigger controller 120 produces a trigger control signal $T_C$ having a defined state, logic level, waveform and the like which is coupled to one or more of the data acquisition devices 110. The external trigger controller 120 is depicted as including a controller 125. The controller 12 may implement any combinational or sequential logic processing operation desired. Moreover, the controller 125 may communicate with the optional communications bus via an optional NID 128. It is noted that the external trigger controller 120 may comprise a single ASIC programmed to perform the specific combinational/sequential logic function of combining the various trigger enable inputs $TE_1$ through $TE_N$ to produce the trigger control signal $T_C$.

The trigger control signal $T_C$ is received at an external trigger input of one or both of the first 111 and second 112 event decoders within an acquisition device 110. The second event decoder 112 is responsive to the decoding or detection of a triggering event based upon the sequential or combinational state of its respective input channels. In response to the sequential or combinational state of the trigger control signal $T_C$, the second event decoder produces a trigger signal T used to control the acquisition unit 113.

The above-described system 100 of FIG. 1 provides for a plurality of data acquisition devices 110, where each acquisition device provides a respective trigger signal determined according to the decoding or detection of sequential and/or logical conditions of its respective input channels, as well as detection of analog signal conditions. The external trigger controller 120 aggregates or combines the trigger signals $TE_1$ through $TE_N$ produced by the data acquisition units $110_1$ through $110_N$ to produce a combined trigger control signal $T_C$. The combined trigger control signal $T_C$ is then used by each of the data acquisition units 110 to control its respective acquisition function. In this manner, a trigger condition having sequential or combinational logic characteristics that exceed the capabilities of any one instrument, such as a DSO or other data acquisition device is realized. For example, a user may suspect that his system under test may be experiencing problems only under certain conditions. In this example those conditions are a "runt" (i.e., less than full amplitude) signal occurring when his eight data lines are in the state 10100101. Thus, the user preprograms external trigger controller 120 to generate a combined trigger only when both of the above conditions are true. Note that all eight data lines (four from each of two oscilloscopes) are logically combined and further combined with the detection of an analog trigger condition (i.e., runt), an outcome heretofore not possible.

It is important to note that although a particular instrument detects or decodes some or all of the trigger criteria, it does not immediately begin acquiring data samples, but rather is substantially simultaneously triggered for data acquisition along with all of the other instruments.

The combined trigger signal $T_C$ allows synchronization of the plurality of data acquisition devices 110. It is herein noted that in order to realize such synchronization, a calibration procedure must be used to determine the delay time between when the trigger enable TE signal is generated and when the trigger signal TO is received (i.e., the "roundtrip" time of the trigger signal). In such a procedure, external trigger controller 120 is instructed to immediately generate a trigger signal in response to receipt of the trigger enable signal without trying to combine the trigger enable signal with any other trigger enable signal. Then, each instrument in turn sends a calibration trigger enable signal to external trigger controller 120 and measures the time until the trigger signal is received from external trigger controller 120. For example, a first test and measurement instrument may record a roundtrip time of 1.2 ns (nanoseconds), and second instrumenent may record a roundtrip tome of 1.4 ns, and a third instrument may record a roundtrip time of 1.6 ns. Such differences in delay time may be a function of cable length between the instrument and external trigger controller 120. It is important that the trigger enable signals are received at external trigger controller 120 substantially simultaneously, so that they may be correctly logically combined. Clearly, the third instrument cannot trigger in advance to make up the time difference. Thus, the first and second instruments must delay the generation of their trigger enable signals by one half of their respective roundtrip times to coincide with the trigger enable signals of the third instrument. Such a solution requires that each instrument "know" the delay times of the others, and indeed, the calibration procedure calls for communication of those delay times to all other instruments in the group (via GPIB, or LAN, for example).

In one embodiment of the invention, the optional trigger logic unit 117 is used to process the trigger signal T produced by the second event decoder 112. In this embodiment, the trigger logic unit (providing a combinatorial and/or sequential logic function) receives the trigger signal T produced by the second event decoder 112 as well as the trigger control signal TC produced by the external trigger controller 120. The trigger logic unit 117 responsively produces a gated trigger signal T' which is coupled to the acquisition unit 113. In one embodiment of the invention, the trigger logic unit 117 has a logical function defined by the controller 115. In this embodiment, the controller 115 communicates with the trigger logic unit 117 to effect any changes in the combinational and/or sequential logic profile of the trigger logic unit 117. Such changes may be appropriate in the case of adapting system operation parameters to specific signals under test, attempting to synchronize various acquisition devices 110 and the like.

In one embodiment of the invention, the controller or either event decoder enables the assertion (i.e., trigger or ready to trigger) of a trigger signal only when the acquisition unit 113 is able to acquire data and/or the processing and display unit 114 is able to further process acquired data.

The acquisition unit 113 utilizes the gated trigger signal T' in substantially the same manner as described above with respect to the trigger signal TE. In this manner, where each of a plurality of acquisition devices 110 utilizes a similar gated triggering mechanism, each of the respective acquisition units 113 of the acquisition devices 110 are triggered at the same time and in response to the same decoded event. This is useful since each instrument or acquisition device 110 may take acquisition at different times if the combined trigger event rate is higher than the slowest acquisition rate since record length, hold off time, processing time and the like may be different such that each instrument or acquisition device 110 is ready for the trigger condition at different times. By utilizing the sequential triggering mechanism enabled by the trigger logic unit 117, each instrument or acquisition device 110 sends its decoded trigger event (from its first event decoder 111) only when it is ready to trigger. In this manner, the resulting combined event or triggering condition provided by the external trigger controller 120 occurs only when all acquisition devices 110 are ready to trigger. Thus, when the combined triggering event occurs, all acquisition devices trigger on the particular event. When any one instrument or acquisition device 110 is triggered, it goes back to a "not ready to trigger" state to mask out the decoded event to the external trigger controller 120. Therefore, each of the instruments or acquisition devices 110 then wait for all of the instruments or acquisition devices to do their respective post-acquisition processing functions prior to the start of the next acquisition cycle.

In one embodiment of the invention, the optional network interface device (NID) 118 is used to enable communications between the acquisition devices 110 and/or a computer (not shown), such as a personal computer (PC), work station or other computing device including standard components such as keyboard entry means, processing means, display means, memory, input/output and the like. Such a computer may perform part of an automatic test system or data acquisition and processing system. The network interface device 118 enables the controller 115 of an acquisition device 110 to coordinate desired triggering events, presentations of acquired data, acquisition of data and other operating parameters. Additionally, in an embodiment where each of the acquisition devices comprises a card or sub-assembly within a larger acquisition device, a control bus BUS cooperating with network interface devices within each of the acquisition devices 110 enables the optional computer to set the various operational parameters of the acquisition devices and retrieve acquired data from the acquisition devices for subsequent presentation on a display device associated with the optional computer, for data analysis or other applications. The computer and/or acquisition devices 110 may also optionally communicate with a controller 125 within the external trigger controller 120. In this manner, full automation and control of the various acquisition devices 110, external trigger controller 120 and other devices (not shown) communicating via the control bus BUS may be provided. This embodiment of the invention works well for individual acquisition devices, such as a plurality of test or measurement instruments (e.g., digital signal oscilloscopes, logic analyzers and the like) or acquisition modules within an acquisition system or computer.

A DSO or other data acquisition device 110 according to an embodiment of the invention includes a triggering system having the ability to deliver a trigger enable signal TE or other indicium of a decoded triggering event to an external trigger controller independent of the event that is actually used to trigger the DSO. Thus, in the data acquisition units 110 of FIG. 1, first 111 and second 112 event decoders are used. The first event decoder 111 decodes or otherwise determines that a triggering event has occurred and, further, provides an indicium of that triggering event to the external trigger controller 120. The second event decoder 112 preferably decodes or determines the occurrence of the same triggering event and responsively produces a triggering signal T adapted to control the acquisition unit 113.

In one embodiment of the invention, only the second event decoder 112 is further controlled using the trigger control signal $T_C$ produced by the external trigger controller 120. In this embodiment of the invention, the first event decoder 111 continually indicates the presence or absence of the triggering event, while the second event decoder 112 triggers the acquisition unit 113 in response to both the presence (or absence) of the triggering event as well as the state of the trigger control signal $T_C$.

In another embodiment of the invention, a single event decoder is utilized (i.e., the functions of the first 111 and second 112 event decoders are combined). In this embodiment of the invention, a trigger output signal T provided by the combined event decoders is coupled to both the external trigger controller 120 and the acquisition unit 113. Optionally, the trigger enable signal TE is coupled to the external trigger controller 120 and the trigger logic unit 117, such that the trigger logic unit 117 further controls the operation of the acquisition unit 113.

The combined triggering event enabled by the invention is used to trigger each of the multiple instruments and, thereby, synchronize operation of the instruments. In an alternate embodiment of the invention, acquisition times between instruments having different operational parameters (e.g., acquisition speed, acquisition rate, record length, hold-off time, processing time and the like) are adapted to enable a relatively synchronized data acquisition process across multiple instrument platforms such that resulting acquired data from the various channels in the various instruments may be usefully synchronized and otherwise processed.

Figure 2:
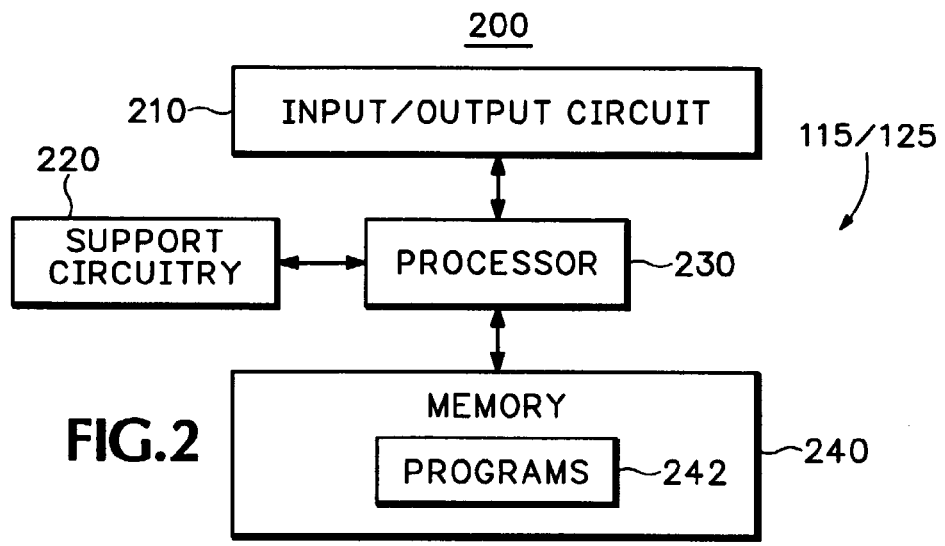
FIG. 2 depicts a high-level block diagram of a controller suitable for use in the signal analysis system of FIG. 1.

FIG. 2 depicts a high level-block diagram of a controller suitable for use in a signal analysis system of FIG. 1. Specifically, the controller 200 of FIG. 2 may be employed to implement functions of the controller 115 in an acquisition device 110 and/or the controller 125 in an external trigger controller 120. The controller 200 of FIG. 2 comprises a processor 230 as well as memory 240 for storing various control programs and other programs 242. The processor 230 cooperates with conventional support circuitry 220 such as power supplies, clock circuits, cache memory and the like as well as circuits that assist in executing the software routine stored in the memory 240. As such, it is contemplated that some of the steps discussed herein as software processes may be implemented within hardware, for example as circuitry that cooperates with the processor 230 to perform various steps. The controller 200 also contains input/output (I/O) circuitry 210 that forms an interface between the various functional elements communicating with the controller. Although the controller 200 of FIG. 2 is depicted as a general purpose computer that is programmed to perform various control functions in accordance with the present invention, the invention can be implemented in hardware as, for example, an application specific integrated circuit (ASIC). As such, the process steps described herein are intended to be broadly interpreted as being equivalently performed by software, hardware or a combination thereof.

Figure 3:
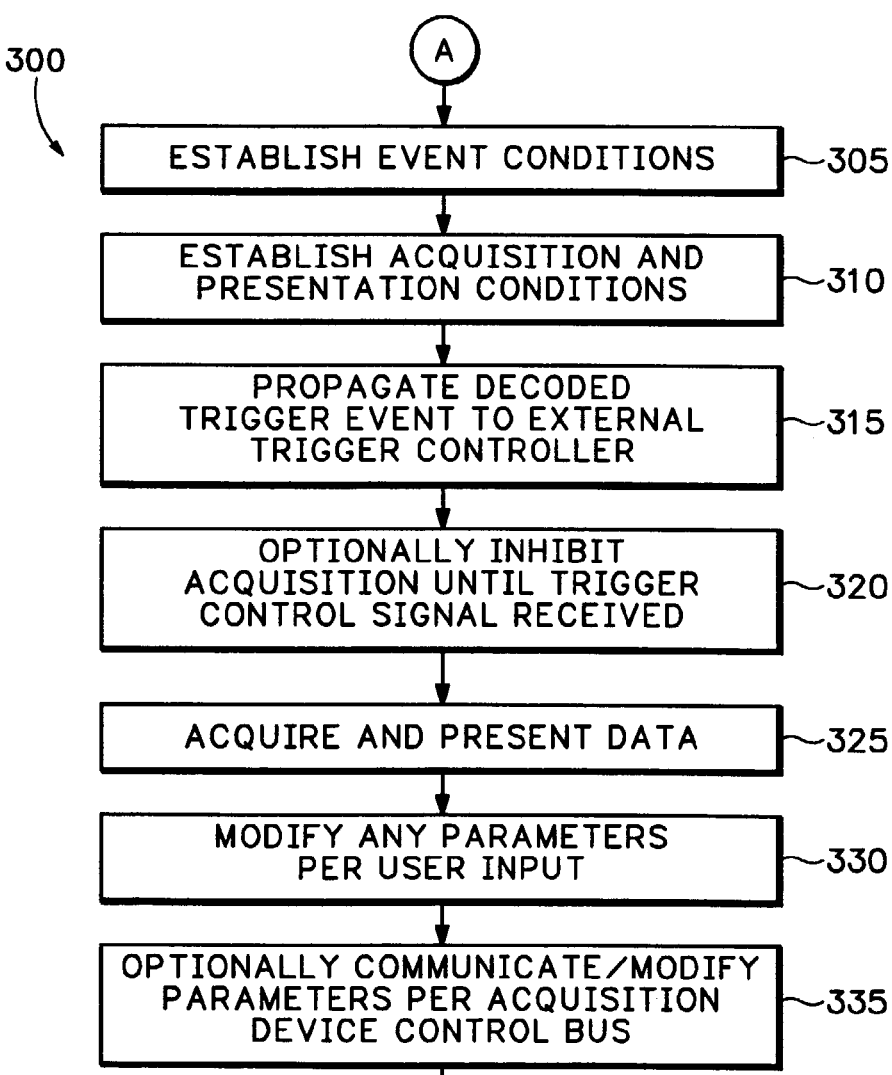
FIG. 3 depicts a flow diagram of a method according to an embodiment of the present invention.

FIG. 3 depicts a flow diagram of a method according to an embodiment of the present invention. Specifically, the method 300 of FIG. 3 depicts various steps implemented by hardware and/or software components within an acquisition device 110.

At step 305, the trigger event conditions associated with the event decoders 111, 112 are established. At step 310, the acquisition and presentation conditions associated with the acquisition unit 113 and, optionally, processing and display unit 114 are established. At step 315, a decoded trigger event is propagated to the external trigger controller 120. At step 320, the trigger signal T normally used to trigger the acquisition unit 113 is optionally inhibited until the trigger control signal $T_C$ is received from the external trigger controller 120. At step 325, the acquisition unit 113 acquires appropriate data and, optionally, the processing and display unit 114 present the acquired data. It is noted that in an embodiment of the invention utilizing the communications bus, the acquired data may also be propagated at this time to other acquisition devices 110 or an optional computer (not shown). At step 330, any parameters are modified in response to user interaction with the input unit 116. At step 335, any parameters are modified in response to communications received via the acquisition device control bus BUS. Steps 305-335 are then repeated.

In one embodiment of the invention, a computing device such as a personal computer (PC) receives signal acquisition devices in each of a plurality of internal slots within an external assembly (e.g., a "rack" of test and measurement devices) in communication with the PC. The computing device also includes an external trigger controller in an additional slot, or performs a logical operation that replicates the function of the previously described external trigger controller. It will be noted that the term "slot" is to be broadly construed as any means of electrical and/or mechanical communication of a signal acquisition device or test and measuring device with the PC. Moreover, the PC discussed herein is to be broadly construed as any computing device or platform having comparable functions, such as an Apple® Macintosh® computer, Sun Microsystems® computing platform and the like. It will be further appreciated that the paths used to route trigger enable and/or trigger control signals between the various components (e.g., scopes 110 and trigger controller 120) may be formed using discrete wiring between the various components or via the bus architecture associated with the PC.

While the foregoing is directed to the preferred embodiment of the present invention, other and further embodiments of the invention may be devised without departing from the basic scope thereof, and the scope thereof is determined by the claims that follow.

What is claimed is:

1. A system for triggering a plurality of test and measurement instruments substantially simultaneously, comprising:
    a first test and measurement instrument having an input for receiving a first signal under test, an output for developing a first trigger enable signal, and a first external trigger input;
    a second test and measurement instrument having an input for receiving a second signal under test, an output for developing a second trigger enable signal, and a second external trigger input; and
    circuitry for logically combining said first and second trigger enable signals to generate a combined trigger signal;
    said combined trigger signal being applied to the first and second external trigger inputs; and
    said first and second test and measurement instruments acquiring data samples of said first and second signals under test in response to said combined trigger signal.

2. The system of claim 1 wherein each of said first and second test and measurement instruments is one of an oscilloscope and a logic analyzer.

3. The system of claim 1 wherein each trigger enable signal is indicative of one of a decoding of the logic state of said corresponding signal under test and a detection of an analog condition of said corresponding signal under test.

4. A method of substantially simultaneously triggering a plurality of acquisition devices comprising:
    logically combining a trigger enable signal provided by each of the acquisition devices, each acquisition device receiving a different signal under test, to produce a combined trigger signal, said combined trigger signal enabling substantially simultaneous acquisition of data samples from the different signals under test by said devices;
    wherein each trigger enable signal is generated in response to a determination of an occurrence of a predefined triggering event in the respective signal under test;
    each trigger enable signal produced by the respective acquisition device is only asserted when the device is ready to acquire the respective signal under test;
    at least one of said acquisition devices logically combines said combined triggering signal with a respective triggering signal to control the acquisition of the respective signal under test.

5. The method of claim 4, wherein each device receives the respective signal under test as a plurality of signals under test, said plurality of signals under test being acquired in response to said combined trigger signal.

6. The method of claim 4, wherein each device receives the respective signal under test as a plurality of signals under test, each of said plurality of signals under test being acquired in a synchronized manner in response to said combined trigger signal and the respective logical event indicative signal.

7. The method of claim 4, wherein each of said acquisition devices comprises at least one of a digital storage oscilloscope (DSO) and a logic analyzer.

* * * * *